(12) United States Patent
Anim-Appiah et al.

(10) Patent No.: US 7,904,496 B2
(45) Date of Patent: Mar. 8, 2011

(54) METHOD AND SYSTEM FOR SELECTING EFFECTIVE TAP VALUES FOR A DIGITAL FILTER

(75) Inventors: Kofi Dankwa Anim-Appiah, Allen, TX (US); Nirmal C. Warke, Irving, TX (US)

(73) Assignee: Texas Instruments Incorporated, Dallas, TX (US)

( * ) Notice: Subject to any disclaimer, the term of this patent is extended or adjusted under 35 U.S.C. 154(b) by 1164 days.

(21) Appl. No.: 11/338,570

(22) Filed: Jan. 24, 2006

(65) Prior Publication Data
US 2007/0174375 A1  Jul. 26, 2007

(51) Int. Cl.
*G06F 17/10* (2006.01)
(52) U.S. Cl. .................................................. 708/300
(58) Field of Classification Search ........... 708/300–323
See application file for complete search history.

(56) References Cited

U.S. PATENT DOCUMENTS

| | | | |
|---|---|---|---|
| 5,058,047 A | 10/1991 | Chung | |
| 6,788,785 B1 | 9/2004 | Ding | |
| 6,970,896 B2 * | 11/2005 | Awad et al. | 708/322 |
| 7,191,025 B2 * | 3/2007 | Allred | 708/300 |
| 7,293,055 B2 * | 11/2007 | McAdam et al. | 708/322 |
| 2004/0062302 A1 | 4/2004 | Fujii et al. | |
| 2005/0053129 A1 | 3/2005 | Yousef | |

* cited by examiner

*Primary Examiner* — Tan V Mai
(74) *Attorney, Agent, or Firm* — Jacqueline J. Garner; Wade J. Brady, III; Frederick J. Telecky, Jr.

(57) ABSTRACT

Systems and methods are provided for determining effective tap values for a digital filter. A first plurality of vectors is generated, wherein each of the first plurality of vectors represents a set of tap values for the filter at a first resolution. A best vector is selected from the first plurality of vectors according to a first performance metric. A second plurality of vectors is generated within a threshold distance of the selected best vector, wherein each of the second plurality of vectors represents a set of tap values for the filter at a second resolution that is superior to the first resolution. A best vector is selected from the second plurality of vectors according to a second performance metric.

6 Claims, 4 Drawing Sheets

METHOD AND SYSTEM FOR SELECTING EFFECTIVE TAP VALUES FOR A DIGITAL FILTER

TECHNICAL FIELD

The present invention is directed generally to electronic systems and is particularly directed to a method and apparatus for selecting effective tap values for a digital filter.

BACKGROUND

Digital filters have become increasingly commonplace in signal processing applications, as they can achieve virtually any filtering effect that can be expressed as a mathematical algorithm. Digital filters exhibit many advantages such as, for example, high reliability, minimal drift over time or in changing conditions, and superior transmission performance. A digital filter can include one or more taps, the number of taps depending, at least in part, upon the desired accuracy in realizing the nominal characteristics of the filter. An increase in the number of sections a digital filter provides a corresponding increase in the accuracy to which the desired filter characteristics can be obtained.

To implement a digital filter, it is necessary to provide a filter coefficient, or tap value, for each tap of the filter. This can be accomplished by storing the tap value at a desired resolution in a memory of a device employing the filter. Increasing the resolution of the tap values increases the accuracy at which a desired tap value can be expressed, and accordingly, the accuracy with which desired filter characteristics can be obtained. It will be appreciated, however, that increasing the number or resolution of the tap values in a filter exponentially increases the number of tap value combinations, and thus the computational expense, of determining an optimal set of values for a given filter. There is, therefore, a trade-off between the time necessary to configure a digital filter for a given application (e.g., at a system initialization), and the degree to which desired filter characteristics can be achieved.

SUMMARY

In accordance with one aspect of the present invention, a method is provided for determining effective tap values for a digital filter. A first plurality of vectors is generated, wherein each of the first plurality of vectors represents a set of tap values for the filter at a first resolution. A best vector is selected from the first plurality of vectors according to a first performance metric. A second plurality of vectors is generated within a threshold distance of the selected best vector, wherein each of the second plurality of vectors represents a set of tap values for the filter at a second resolution that is superior to the first resolution. A best vector is selected from the second plurality of vectors according to a second performance metric.

In accordance with another aspect of the present invention, a system is provided for determining effective tap values for a digital filter. A tap selector establishes a search space of vectors, where a given vector represents a set of tap values for the digital filter at a first resolution, and selects a vector from the established search space for evaluation. A filter evaluator evaluates the performance of the digital filter configured with the tap values represented by the selected vector. The filter evaluator determines a performance metric for the selected vector. The tap selector is operative to select a best vector from the search space of vectors based upon the determined performance metrics for the search space of vectors and to generate a new search space of vectors, each representing a set of tap values at a second resolution that is finer than the first resolution.

In accordance with yet another aspect of the present invention, a system is provided for determining effective tap values for a digital filter. The system includes means for generating a first plurality of vectors, wherein each of the first plurality of vectors represents a set of tap values for the filter at a first resolution. The system also includes means for selecting a best vector from the first plurality of vectors according to a first performance metric. The system also includes means for generating a second plurality of vectors within a threshold distance of the selected best vector, wherein each of the second plurality of vectors represents a set of tap values for the filter at a second resolution that exceeds the first resolution. The system also includes means for selecting a best vector from the second plurality of vectors according to a second performance metric.

BRIEF DESCRIPTION OF THE DRAWINGS

The foregoing and other features and advantages of the present invention will become apparent to those skilled in the art to which the present invention relates upon reading the following description with reference to the accompanying drawings, in which.

DETAILED DESCRIPTION

Figure 1:
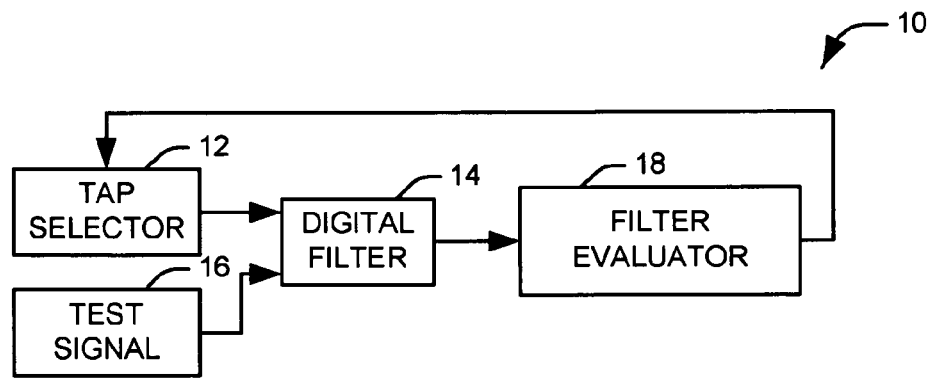
FIG. 1 illustrates a system for determining an effective set of tap values for a digital filter in accordance with an aspect of the present invention.

FIG. 1 illustrates a system 10 for determining an effective set of tap values for a digital filter in accordance with an aspect of the present invention. The system 10 utilizes an exhaustive search of the combinations of digital tap values at a first, coarse resolution. As used in the context of performing a search, the resolution is the number of bits utilized to express the digital tap values. For example, the initial exhaustive search can be conducted through sets of digital filter values that are represented at two-bits. Once the best combination of tap values has been determined, the resolution of the various tap values can be increased and a new search space can defined around the selected set of tap values. Specifically, all tap value combinations at the new resolution that are close to the selected tap values can be included in the new search space. This is continued iteratively until a desired resolution is achieved. It will be appreciated that this approach is significantly more efficient than an exhaustive search at full resolution, and will provide an optimal or near optimal combination of tap values for the digital filter.

A tap selector 12 generates the initial search space, comprising the plurality of tap value combinations at a coarse resolution. It will be appreciated that what constitutes a coarse resolution will vary with the desired final resolution of the tap values. Thus, the original resolution can vary from a single bit representation of the values to a representation that is one-bit less than the desired resolution. In accordance with an aspect of the present invention, the initial search space contains every possible combination of tap values, represented as vectors within a multidimensional space defined by the number of filter taps, subject to any constraints on the filter taps. For example, the filter taps may be constrained such that the tap values sum to a particular value or such that their squares sum to a particular value. Any combinations of filter values that do not meet the constraint are excluded from the search space.

The tap selector 12 selects a vector of tap values from the initial search space and provides it to a digital filter 14. It will be appreciated that the digital filter 14 can be implemented in hardware or as a software representation of a digital filter to be optimized. The digital filter 14 receives a test signal provided by a test signal source 16. The test signal can comprise a representation of a desired signal having one or more characteristics of the environment in which the filter is intended to operate. For example, where the intended environment is a transmission line, such as a backplane channel, the signal can be generated as to simulate intersymbol interference.

The filtered output is then provided to a filter evaluator 18. The filter evaluator 18 compares the filter output with a reference signal to determine the effectiveness of the digital filter 14. For example, the filter evaluator 18 can determine a bit error rate can be determined for the filter signal, and the bit error rate can be utilized to calculate a performance metric. Alternatively, the filter evaluator 18 can determine a frequency response of the filter can be determined and quantified as a performance metric, for example, as part of a partial response signaling arrangement. The performance metric calculated for the selected vector can then be provided to the tap selector 12. Those skilled in the art will understand and appreciate other performance metric (or combination of metrics) that can be employed to evaluate the efficacy of the filter tap values at a given resolution. The particular performance metric may vary according to the particular application in which the filter is being used.

Once every vector within the search space has been evaluated by the filter evaluator 18, the tap selector 12 can select an optimal vector from the search space. The tap selector 12 can then construct a new search space around the vector at a higher resolution. For example, the resolution of the tap values comprising the search space can be increased by one bit. The new search space, however, is limited to combinations of tap values that are similar (e.g., proximate within the multidimensional space defined by the tap values) to the selected optimal combination of tap values. This can be conceptualized as a threshold distance defined around the optimal vector. It will be appreciated that the threshold distance will vary with the application.

In one implementation, the threshold distance is computed as a Euclidian distance, such that the sum of the squared differences between corresponding tap values in a given vector and the selected optimal vector must fall below the threshold for the given vector to fall within the search space. Alternatively, the threshold distance can be expressed as a Chebyshev distance, such that a pair of corresponding tap values in a given vector and the selected vector cannot differ by more than the threshold for the given vector to fall within the search space. Once an appropriate search space has been defined, it can be subjected to any constraints associated with the filter to eliminate vectors that do not fit within the constraint.

Each vector within the new search space can then be provided to the digital filter 14 for evaluation, as described above. An optimal vector can be determined for the new search space, and another search space can be established at a threshold distance around the newly determined optimal vector at another, higher resolution. It will be appreciated that the threshold distance utilized to establish the new search can be smaller than that used to generate the previous search space. This process can be continued iteratively, with the radius of the search space decreasing and the resolution of the tap values increasing, until a search space having a desired resolution is achieved. At this point, the optimal vector within the search space having the desired resolution can be selected.

Figure 2:
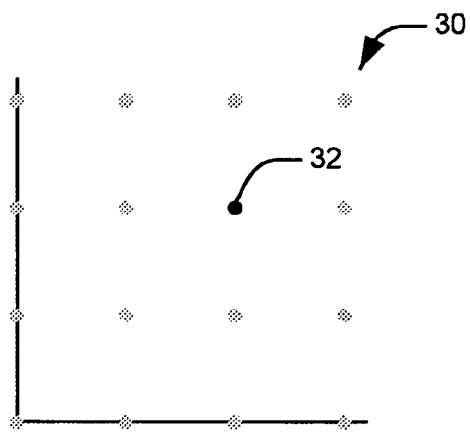
FIG. 2 illustrates a first exemplary search space for an optimization system for a digital filter in accordance with an aspect of the present invention.

FIG. 2 illustrates a first exemplary search space 30 for an optimization system for a digital filter in accordance with an aspect of the present invention. In the illustrated example, the filter is considered to have two taps to maintain the illustrated search space in two-dimensions for ease of illustration. It will be appreciated that in practice, the filter can have a larger number of taps, necessitating a higher dimensionality search space. In the initial search space 30, the components defining each vector are expressed with a resolution of two bits. At two bits, the vectors can assume any of four possible values along the two dimensions defined by the vector components for a total of sixteen vectors in the search space. For the purpose of illustration, it is assumed that no constraint is imposed on the tap values.

An optimal vector 32 is selected from the search space 30 according to an appropriate performance metric. The performance metric can be determined by simulating or reproducing the environment in which the filter will be operated and comparing the performance of the filter configured with the tap values associated with the vector with a reference. For example, the test signal can be generated as to contain significant intersymbol interference. The performance metric can include the bit error rate of the filter output or a difference between the frequency response of the filter and a desired frequency response. The selected optimal vector is then utilized to generate a new search space at a higher resolution.

Figure 3:
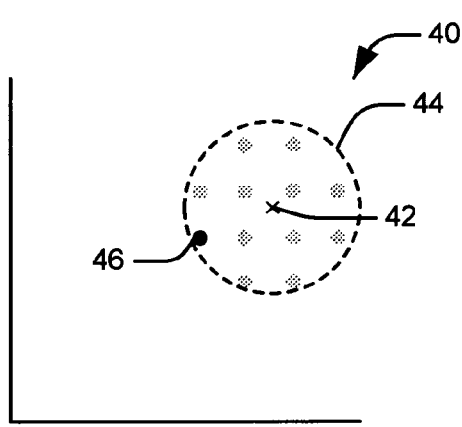
FIG. 3 illustrates a second exemplary search space for an optimization system for a digital filter in accordance with an aspect of the present invention.

FIG. 3 illustrates a second search space 40 for an optimization system for a digital filter in accordance with an aspect of the present invention. The second search space 40 comprises a plurality of vectors at a second resolution that are within a threshold distance of a previously selected optimal vector 42 (e.g., vector 32 of FIG. 2). In the illustrated search space, the vectors are represented at a resolution of three bits. The threshold distance around the optimal vector 42 is represented in the illustration by a circle 44 having radius equal to the threshold distance. It will be appreciated that the threshold distance can be selected as to maintain a desired number of vectors within the search space at each step. An optimal vector 46 is selected from the search space according to an appropriate performance metric. The selected optimal vector is then utilized to generate a new search space at a higher resolution.

Figure 4:
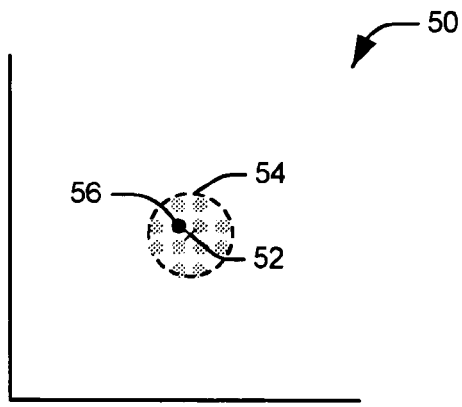
FIG. 4 illustrates a third exemplary search space for an optimization system for a digital filter in accordance with an aspect of the present invention.

FIG. 4 illustrates a third search space 50 for an optimization system for a digital filter in accordance with an aspect of the present invention. The third search space 50 comprises a plurality of vectors at a third resolution that are within a threshold distance of the previously selected optimal vector 52 (e.g., vector 46 of FIG. 3). In the illustrated search space 50, the vectors are represented at a resolution of four bits. The new search space 50 is defined within a threshold distance 54 of the previously determined optimal vector 52. An optimal vector 56 is selected from the search space according to an appropriate performance metric. The selected optimal vector 56 is then utilized to generate a new search space at a higher resolution.

Figure 5:
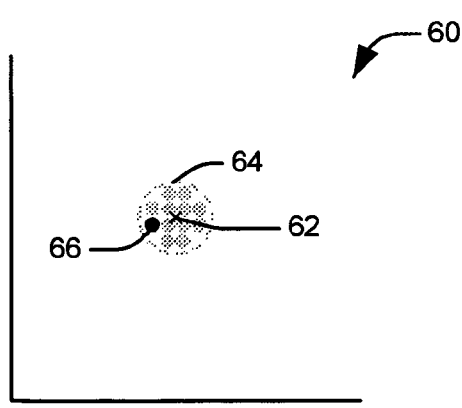
FIG. 5 illustrates a fourth exemplary search space for an optimization system for a digital filter in accordance with an aspect of the present invention.

FIG. 5 illustrates a fourth search space 60 for an optimization system for a digital filter in accordance with an aspect of the present invention. The fourth search space 60 comprises a plurality of vectors at a fourth resolution that are within a threshold distance of the previously selected optimal vector 62 (e.g., vector 56 of FIG. 4). In the illustrated search space, the vectors are represented at a resolution of five bits. The new search space 60 is defined within a threshold distance 64 of the optimal vector 62. An optimal vector 66 is selected from the search space according to an appropriate performance metric. In the illustrated example, it is assumed that five bits is a sufficient resolution for the digital filter, and the selected optimal vector is accepted to provide the tap values for the digital filter.

Figure 6:
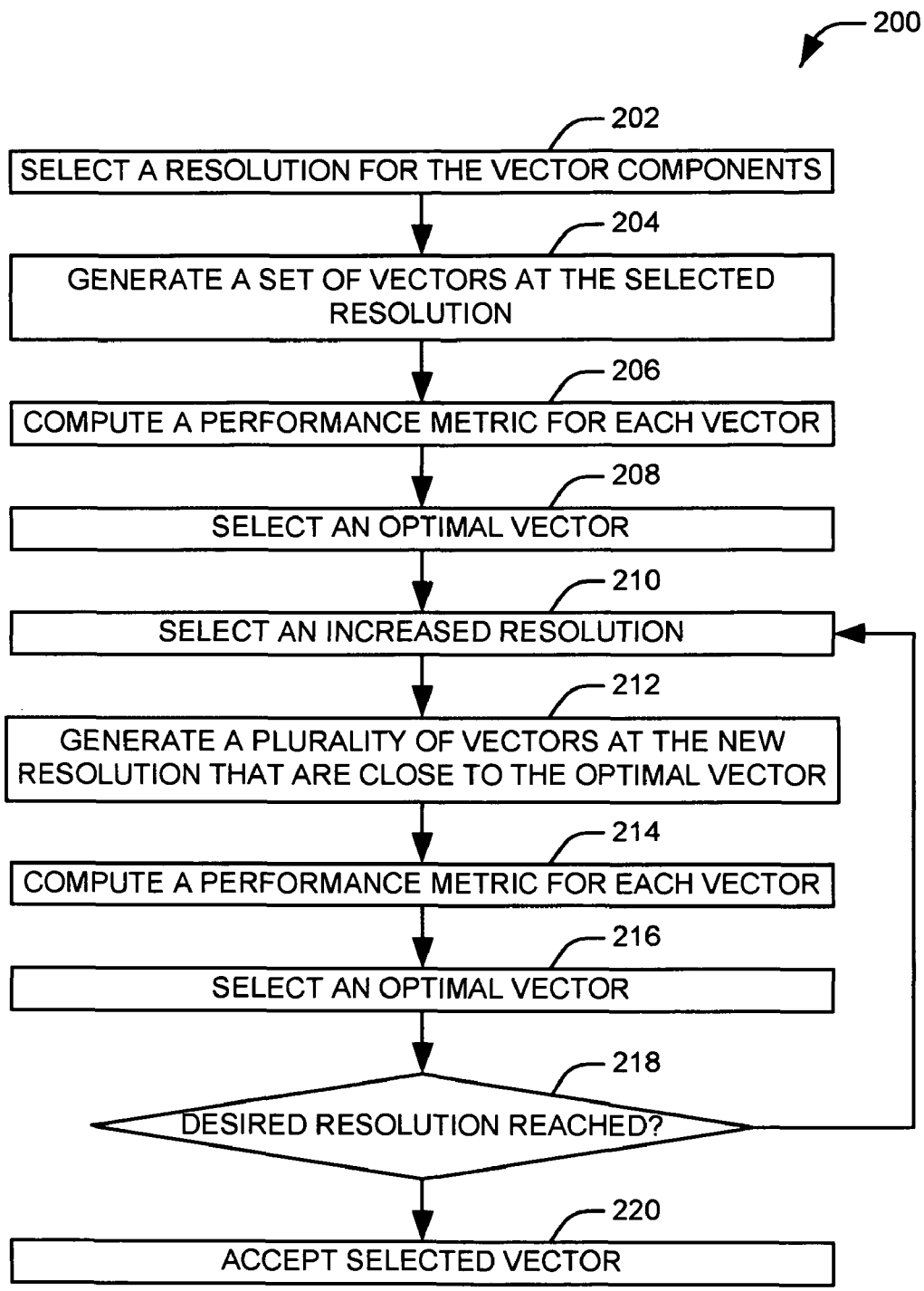
FIG. 6 illustrates a methodology for determining a set of optimal tap values for a digital filter in accordance with an aspect of the present invention.

In view of the foregoing structural and functional features described above, methodologies in accordance with various aspects of the present invention will be better appreciated with reference to FIG. 6. While, for purposes of simplicity of explanation, the methodology of FIG. 6 is shown and described as executing serially, it is to be understood and appreciated that the present invention is not limited by the illustrated order, as some aspects could, in accordance with the present invention, occur in different orders and/or concurrently with other aspects from that shown and described herein. Moreover, not all illustrated features may be required to implement a methodology in accordance with an aspect of the present invention. It will further be appreciated that the methodology can be implemented as hardware, software, or a combination of hardware and software.

FIG. 6 illustrates a methodology 200 for determining a set of optimal tap values for a digital filter in accordance with an aspect of the present invention. For the purposes of the methodology, the determination of an optimal set of N tap values can be conceptualized as a search for an optimal vector in an N-dimensional feature space that represents the tap values providing an optimal or near optimal performance of the filter. In the determined vector, each tap value is represented by a vector component having a digital value expressed at a desired resolution (e.g., eight bits or sixteen bits).

At 202, a resolution less than the desired resolution is selected. An appropriate initial resolution can be determined empirically for a given application. At 204, a comprehensive set of vectors is generated at the selected resolution to create an initial search space. For example, when the tap values are unconstrained, the initial search space can include a number of vectors equal to $N^R$, when N is the number of taps and R is the number of values that a given vector component can assume at the selected resolution. In one implementation for determining values for a four tap filter, the initial resolution can be selected to be two-bits, such that two hundred fifty-six vectors are searched.

In some applications, filter taps are often constrained by an available voltage, such that the values associated with the plurality of filter taps sum to a constant value. Alternatively, the sum of the squares of the vector components (e.g., the magnitude of the vector) can be constrained to a constant value. In constrained implementation, vectors from the set of generated vectors that do not meet the constraint are eliminated to provide a comprehensive search space of constrained vectors. It will be appreciated that the initial resolution can be selected to be higher in a constrained implementation, as the search space will be narrowed by the constraint.

At 206, a performance metric is generated for each of the plurality of generated vectors. For example, the filter can be utilized in a simulated system, and the performance of the filter can be determined by comparing the filter output to a known signal content. The filter performance can be quantified as a bit error rate or a frequency response; although, the method is not limited to any of these performance metrics. Where the filter is utilized as an equalizer, the filter can be utilized in combination with a simulated transmission line and a test signal can be compared with a reference signal to determine the performance of the filter with a given set of taps. Once a performance metric is generated for each of the plurality of vectors, an optimal vector can be selected at 208. The selection of the optimal vector will depend on the nature of the performance metric.

At 210, the selected resolution is increased by one increment. For example, the resolution can be increased by one bit. At 212, a plurality of vectors that are close to the selected optimal vector can be generated to form a new search space. Determining what vectors are close to the optimal vector can be accomplished via a number of methods, depending on the application. For example, all vectors within a threshold distance (e.g., Euclidian, Manhattan, Chebyshev, Canberra, etc.) can be included in the new search space. Alternatively, a predetermined number of closest vectors can be selected. It will be appreciated that in an application in which the tap values are constrained, it will be necessary to again remove vectors that do not meet the constraint from the search space. It will further be appreciated that the threshold used to define "close" vectors can be expanded in a constrained implementation as the number of vectors within a given distance of the selected vector will be decreased by the constraint.

At 214, a performance metric is computed for each of the vectors. Generally, this will be done in the same manner as the performance metric was computed for the initial search space in 206. An optimal vector can be selected from the new search space at 216 according to the computed performance metrics. It is then determined at 218 if the desired resolution has been achieved. If the desired resolution has not been achieved (N), the methodology 200 returns to 210, where the resolution is increased by one increment and a new search space is generated from vectors close to the selected optimal vector. If the desired resolution has been reached (Y), the selected optimal vector is accepted at 220.

Figure 7:
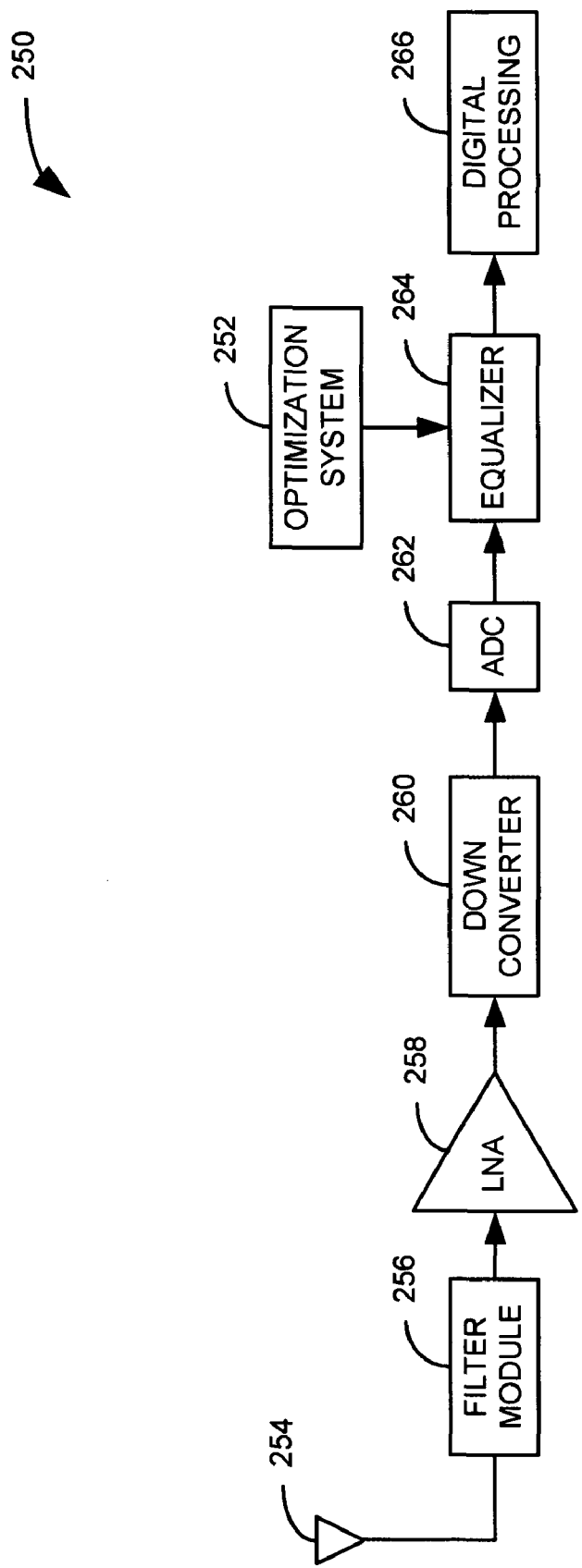
FIG. 7 illustrates a receiver system utilizing an equalizer optimization system in accordance with an aspect of the present invention.

FIG. 7 illustrates a receiver system 250 utilizing an equalizer optimization system 252 in accordance with an aspect of the present invention. The receiver 250 includes an antenna 254 that receives a signal at a transmission frequency and a filter module 256 that filters the received signal to isolate one or more frequency bands of interest. A low noise amplifier (LNA) 258 amplifies the filtered signal and provides it to a down-conversion module 260, where the signal is downconverted to a lower frequency (e.g., a baseband frequency). The downconverted signal is converted to a digital signal at an analog to digital converter 262.

The digital signal is provided to an equalizer 264 implemented as a digital filter. The equalizer 264 corrects the digital signal for errors due to transmission, for example, timing errors due to multipath and interference. In accordance with an aspect of the present invention, an optimal set of filter taps associated with the equalizer 264 can be selected by the optimization system 252 via the search process described herein with respect to FIGS. 1-6. For example, the optimization system 252 can operate when the receiver system 250 is initialized (e.g., during a training procedure) to generate effective tap values for the equalizer 264. The equalized signal is then provided to a digital processing component 266 that extracts transmitted data from the digital signal.

Figure 8:
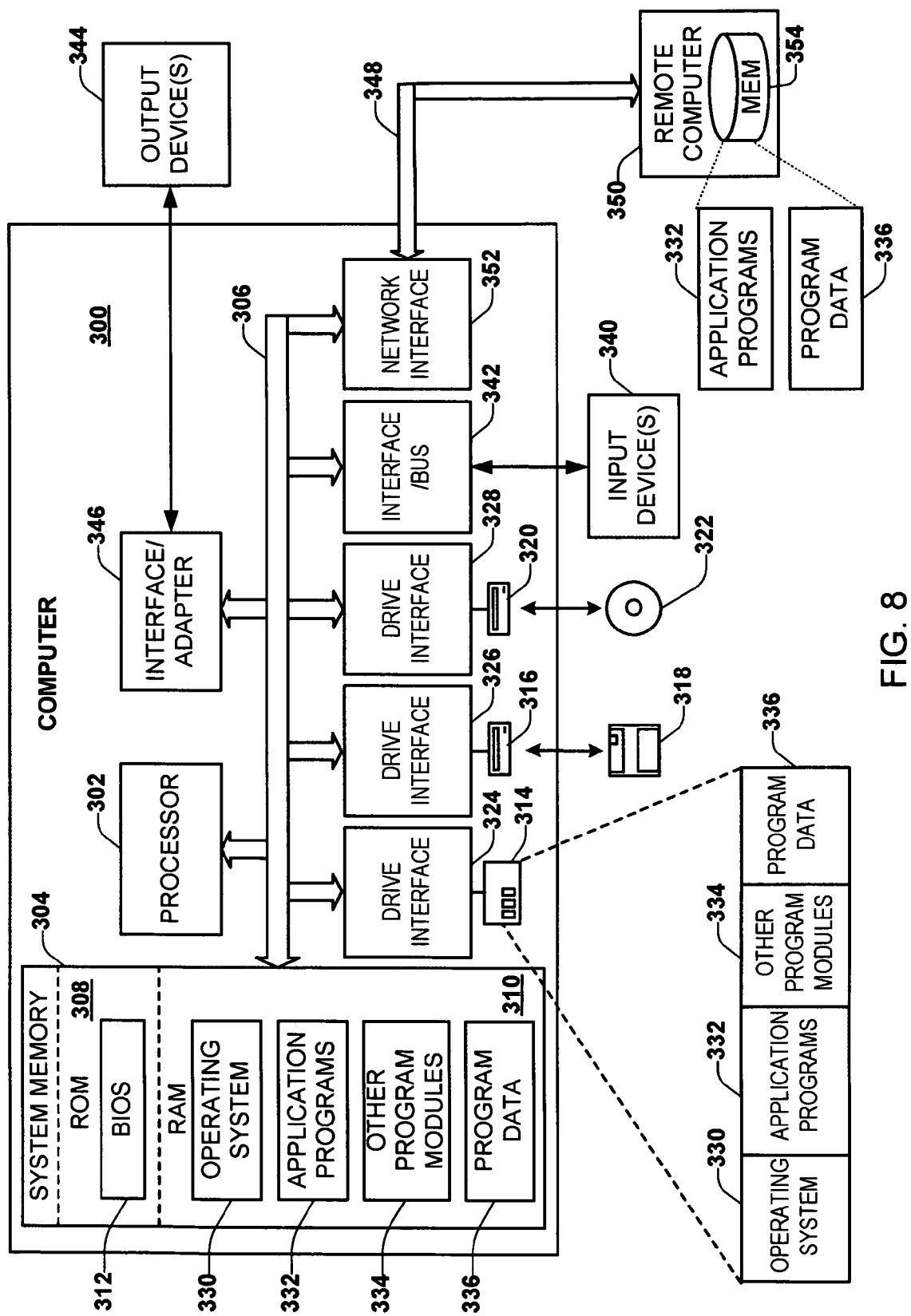
FIG. 8 illustrates a computer system that can be employed to implement systems and methods in accordance with the present invention.

FIG. 8 illustrates a computer system 300 that can be employed to implement systems and methods described herein, such as based on computer executable instructions running on the computer system. The computer system 300 can be implemented on one or more general purpose networked computer systems, embedded computer systems, routers, switches, server devices, client devices, various intermediate devices/nodes and/or stand alone computer systems. Additionally, the computer system 300 can be implemented as part of the computer-aided engineering (CAE) tool running computer executable instructions to perform a method as described herein.

The computer system 300 includes a processor 302 and a system memory 304. A system bus 306 couples various system components, including a coupling of the system memory 304 to the processor 302. Dual microprocessors and other multi-processor architectures can also be utilized as the processor 302. The system bus 306 can be implemented as any of several types of bus structures, including a memory bus or memory controller, a peripheral bus, and a local bus using any of a variety of bus architectures. The system memory 304 includes read only memory (ROM) 308 and random access memory (RAM) 310. A basic input/output system (BIOS) 312 can reside in the ROM 308, generally containing the basic routines that help to transfer information between elements within the computer system 300, such as a reset or power-up.

The computer system 300 can include a hard disk drive 314, a magnetic disk drive 316, (e.g., to read from or write to a removable disk 318), and an optical disk drive 320, (e.g., for reading a CD-ROM or DVD disk 322 or to read from or write to other optical media). The hard disk drive 314, magnetic disk drive 316, and optical disk drive 320 are connected to the system bus 306 by a hard disk drive interface 324, a magnetic disk drive interface 326, and an optical drive interface 334, respectively. The drives and their associated computer-readable media provide nonvolatile storage of data, data structures, and computer-executable instructions for the computer system 300. Although the description of computer-readable media above refers to a hard disk, a removable magnetic disk and a CD, other types of media which are readable by a computer, may also be used. For example, computer executable instructions for implementing systems and methods described herein may also be stored in magnetic cassettes, flash memory cards, digital versatile disks and the like.

A number of program modules may also be stored in one or more of the drives as well as in the RAM 310, including an operating system 330, one or more application programs 332, other program modules 334, and program data 336. The program modules can be programmed with instructions to perform a method based on the teachings contained herein (e.g., FIGS. 2-6).

A user may enter commands and information into the computer system 300 through user input device 340, such as a keyboard or a pointing device (e.g., a mouse). Other input devices may include a microphone, a joystick, a game pad, a scanner, a touch screen, or the like. These and other input devices are often connected to the processor 302 through a corresponding interface or bus 342 that is coupled to the system bus 306. Such input devices can alternatively be connected to the system bus 306 by other interfaces, such as a parallel port, a serial port or a universal serial bus (USB). One or more output device(s) 344, such as a visual display device or printer, can also be connected to the system bus 306 via an interface or adapter 346.

It will be appreciated that the present invention can utilize the computer system 300 in communication with an external digital filter (not shown), such as through the one or more input interfaces 342 and the one or more output interfaces 346. The various tap combinations can be generated and evaluated at the computer system 300 as part of a program module 334. The computer system 300 can include one or more preprogrammed test signals in memory (e.g., at the hard disk drive 314). A test signal, as well as a selected set of filter taps, can be provided to the digital filter via the one or more output interfaces 346. The output of the digital filter can then be provided back to the computer system and compared to the known data content of the test signal to evaluate the performance of the digital filter given the selected tap values. Alternatively, the digital filter can be emulated as part of the within the software running on the computer system 300, such as part of the program module 334 and/or application programs 332 as well as using the program data 336.

As an example, the program module 334 can provide means for generating a first plurality of vectors, wherein each of the first plurality of vectors represents a set of tap values for the filter at a first resolution. The program module 334 can also provide means for selecting a best vector from the first plurality of vectors according to a first performance metric. The program module 334 can also provide means for generating a second plurality of vectors within a threshold distance of the selected best vector, wherein each of the second plurality of vectors represents a set of tap values for the filter at a second resolution that exceeds the first resolution. The program module 334 can also include means for selecting a best vector from the second plurality of vectors according to a second performance metric. Those skilled in the art will understand various ways the program modules might be programmed and/or configured to implement such a system based on the teachings contained herein.

The computer system 300 may operate in a networked environment using logical connections 348 to one or more remote computers 350. The remote computer 348 may be a workstation, a computer system, a router, a peer device or other common network node, and typically includes many or all of the elements described relative to the computer system 300. The logical connections 348 can include a local area network (LAN) and a wide area network (WAN).

When used in a LAN networking environment, the computer system 300 can be connected to a local network through a network interface 352. When used in a WAN networking environment, the computer system 300 can include a modem (not shown), or can be connected to a communications server via a LAN. In a networked environment, application programs 332 and program data 336 depicted relative to the computer system 300, or portions thereof, may be stored in memory 354 of the remote computer 350.

What has been described above includes exemplary implementations of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications, and variations that fall within the spirit and scope of the appended claims.

What is claimed is:

1. An apparatus, comprising:
a digital filter having a input for receiving tap values; and
an optimization system for supplying tap values to the input of the digital filter, the optimization system including:
 a tap selector that establishes a search space of vectors, where a given vector represents a set of tap values for the digital filter at a first resolution, and selects a vector from the established search space; and
 a filter evaluator that evaluates the performance of the digital filter configured with the tap values represented by the selected vector and determines a performance metric for the selected vector, the tap selector being operative to select a best vector from the search space of vectors based upon the determined performance metrics for the search space of vectors and to generate a new search space of vectors, each of the vectors in the new search space representing a set of tap values at a second resolution that is higher than the first resolution.

2. The apparatus of claim 1, wherein the tap selector is operative to generate the new search space of vectors within a threshold distance of the selected best vector.

3. The apparatus of claim 1, further comprising a test signal generator that provides a test signal, having at least one characteristic associated with an operating environment of the digital filter, to the digital filter to provide a filtered test signal.

4. The apparatus of claim 3, the filter evaluator being operative to compare the filtered test signal to a reference signal to determine a bit error rate associated with the digital filter as a performance metric for the selected vector.

5. The apparatus of claim 3, the filter evaluator being operative to evaluate the filtered test signal to determine a frequency response associated with the digital filter as a performance metric for the selected vector.

6. The apparatus of claim 1, wherein at least one of the tap selector and the filter evaluator is implemented as software on a computer readable medium.

* * * * *